(12) United States Patent
Sugimoto et al.

(10) Patent No.: US 12,176,436 B2
(45) Date of Patent: Dec. 24, 2024

(54) SEMICONDUCTOR DEVICE AND SEMICONDUCTOR SYSTEM INCLUDING SEMICONDUCTOR DEVICE

(71) Applicant: FLOSFIA INC., Kyoto (JP)

(72) Inventors: Masahiro Sugimoto, Kyoto (JP); Isao Takahashi, Kyoto (JP); Takashi Shinohe, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 17/258,852

(22) PCT Filed: Jul. 11, 2019

(86) PCT No.: PCT/JP2019/027442
§ 371 (c)(1),
(2) Date: Jan. 8, 2021

(87) PCT Pub. No.: WO2020/013260
PCT Pub. Date: Jan. 16, 2020

(65) Prior Publication Data
US 2021/0328062 A1    Oct. 21, 2021

(30) Foreign Application Priority Data

Jul. 12, 2018    (JP) .................................. 2018-132758

(51) Int. Cl.
*H01L 29/04*    (2006.01)
*H01L 29/10*    (2006.01)
*H01L 29/24*    (2006.01)
*H01L 29/786*   (2006.01)

(52) U.S. Cl.
CPC .......... *H01L 29/7869* (2013.01); *H01L 29/04* (2013.01); *H01L 29/1054* (2013.01); *H01L 29/24* (2013.01); *H01L 29/78696* (2013.01)

(58) Field of Classification Search
CPC ................. H01L 29/04; H01L 29/1054; H01L 29/247869; H01L 29/78696
USPC ........................................................... 257/43
See application file for complete search history.

(56) References Cited

U.S. PATENT DOCUMENTS

| 5,763,655 | A | 6/1998 | Patois et al. |
| 5,989,785 | A | 11/1999 | Ishihara et al. |
| 10,483,402 | B2 * | 11/2019 | Yamazaki ......... H01L 29/78609 |

(Continued)

FOREIGN PATENT DOCUMENTS

| EP | 3 823 039 | 5/2021 |
| JP | 8-227793 | 9/1996 |

(Continued)

OTHER PUBLICATIONS

Kentaro Kaneko, "Growth and physical properties of corundum-structured gallium oxide alloy thin films", Dissertation, Kyoto Univ., pp. 1-116, Mar. 2013 with English Abstract.

(Continued)

*Primary Examiner* — Monica D Harrison
(74) *Attorney, Agent, or Firm* — Wenderoth, Lind & Ponack, L.L.P.

(57) ABSTRACT

A semiconductor device including at least one inversion channel region includes an oxide semiconductor film containing a crystal that has a corundum structure at the inversion channel region.

27 Claims, 9 Drawing Sheets

(56) References Cited

U.S. PATENT DOCUMENTS

| | | | |
|---|---|---|---|
| 2012/0061663 A1* | 3/2012 | Yamazaki | H01L 29/04 257/43 |
| 2013/0187151 A1* | 7/2013 | Yamazaki | H01L 27/1225 257/43 |
| 2013/0221359 A1* | 8/2013 | Cho | H01L 29/66765 438/34 |
| 2014/0225104 A1 | 8/2014 | Yamazaki et al. | |
| 2015/0380529 A1 | 12/2015 | Isobe et al. | |
| 2017/0179249 A1* | 6/2017 | Oda | H01L 21/02565 |
| 2017/0365629 A1* | 12/2017 | Fujimaki | H01L 29/78 |
| 2019/0157400 A1 | 5/2019 | Tanikawa et al. | |
| 2019/0189441 A1 | 6/2019 | Fujita et al. | |

FOREIGN PATENT DOCUMENTS

| | | |
|---|---|---|
| JP | 9-25255 | 1/1997 |
| JP | 11-21687 | 1/1999 |
| JP | 2005-340308 | 12/2005 |
| JP | 2013-058637 | 3/2013 |
| JP | 2016-025256 | 2/2016 |
| WO | WO2018/004008 | 1/2018 |
| WO | WO2018/043503 | 3/2018 |

OTHER PUBLICATIONS

Takemoto Tatsuya, "Power Device Gallium Oxide" Thermal Conductivity, p-type . . . Overcoming Issues and Putting it into Practical Use, EE Times, Japan [online], Retrieved Jun. 21, 2016, from http://eetimes.jp/ee/articles/1402/27/news028_2.html with English translation.

F. P. Koffyberg, "Optical Bandgaps and Electron Affinities of Semiconducting $Rh_2O_3(I)$ and $Rh_2O_3(III)$", J. Phys. Chem. Solids, vol. 53, No. 10, pp. 1285-1288, 1992.

Hideo Hosono, "Functional Development of Oxide Semiconductor", Physics Research, Electronic version, vol. 3, No. 1, 031211, pp. 1-15, (Combined in one volume of Sep. 2013 and Feb. 2014) with English translation.

Written Opinion of the International Searching Authority issued Oct. 8, 2019 in International (PCT) Application No. PCT/JP2019/027442 with English translation.

International Search Report issued Oct. 8, 2019 in (PCT) Application No. PCT/JP2019/027442.

Extended European Search Report dated Feb. 24, 2022 in European Patent Application No. 19833736.2.

English Machine Translation of Office Action issued Mar. 14, 2024 in Taiwanese Patent Application No. 108124325.

Office Action issued Feb. 1, 2024 in European Patent Application No. 19 833 736.2.

Sam-Dong Lee et al., "Thermal stability of single crystalline alpha gallium oxide films on sapphire substrates", Physica Status Solidi C, 2013, vol. 10, No. 11, Nov. 2013, pp. 1592-1595.

Office Action issued Mar. 14, 2024 in Taiwanese Patent Application No. 108124325.

Office Action issued Jun. 28, 2024 in Taiwanese Patent Application No. 108124325, with English-language Translation.

* cited by examiner

SEMICONDUCTOR DEVICE AND SEMICONDUCTOR SYSTEM INCLUDING SEMICONDUCTOR DEVICE

TECHNICAL FIELD

The present disclosure relates to a semiconductor device, which is useful as a power device, for example, and also relates to a semiconductor system including the semiconductor device.

BACKGROUND ART

As a switching device of the next generation achieving high withstand voltage, low losses, and high temperature resistance, semiconductor devices using gallium oxide ($Ga_2O_3$) with a large band gap attract attention and are expected to be applied to power semiconductor devices including an inverter. Also, gallium oxide is expected to be applied to a light emitting and receiving element such as a light emitting diode (LED) and a sensor, since gallium oxide has a wide band gap. According to NPL 1, such gallium oxide has a band gap that may be controlled by forming mixed crystal with indium or aluminum singly or in combination and such a mixed crystal is extremely attractive materials as InAlGaO-based semiconductors. Here, InAlGaO-based semiconductors refer to $In_XAl_YGa_ZO_3$ ($0 \leq X \leq 2$, $0 \leq Y \leq 2$, $0 \leq Z \leq 2$, $X+Y+Z=1.5$ to $2.5$) and can be viewed as the same material system containing gallium oxide.

In recent years, gallium oxide-based p-type semiconductors have been studied. For example, PTL 1 describes a substrate showing p-type conductivity to be obtained by forming a $\beta$-$Ga_2O_3$ crystal by floating zone method using MgO (p-type dopant source). Also, PTL 2 discloses to form a p-type semiconductor by using an ion implantation of p-type dopant into $\alpha$-$(Al_xGa_{1-x})_2O_3$ single crystalline film obtained by Molecular Beam Epitaxy (MBE) method. However, NPL2 discloses that a p-type semiconductor was not obtained by the methods disclosed in PTLs 1 and 2 (NPL2). In fact, there has been no reports of any success in forming a p-type semiconductor by use of the methods disclosed in PTLs 1 and 2. Therefore, gallium oxide-based p-type oxide semiconductor and a method of manufacturing a p-type oxide semiconductor have been desired to be realized.

Also, NPLs 3 and 4 disclose that for example, a use of $Rh_2O_3$ or $ZnRh_2O_4$ as a p-type semiconductor has been considered. Nevertheless, $Rh_2O_3$ has a problem with a raw material that tends to be low in concentration especially in film forming process, and a low concentration of the raw material affects forming films. In addition, it has been difficult to produce a single crystal of $Rh_2O_3$ even if using an organic solvent. Also, even though Hall effect measurement was conducted, $Rh_2O_3$ and $ZnRh_2O_4$ were not determined to be p-type or the measurement itself might not be well done. Further, for example, Hall coefficient of these semiconductors were measurement limit ($0.2$ $cm^3/C$) or less that was not useful at all. Also, since $ZnRh_2O_4$ has a low mobility and a narrow band gap, $ZnRh_2O_4$ cannot be used for LED or power devices. Therefore, $Rh_2O_3$ and $ZnRh_2O_4$ were not necessarily satisfactory.

As a wide band gap semiconductor besides $Rh_2O_3$ and $ZnRh_2O_4$, various p-type oxide semiconductors have been investigated. PTL3 discloses that delafossite or oxychalcogenide are used as p-type semiconductors. However, the semiconductor using delafossite or oxychalcogenide has a mobility of as low as 1 $cm^2/Vs$ or less and insufficient electrical properties and thus, the semiconductor using delafossite or oxychalcogenide could not form a p-n junction properly with a next generation n-type oxide semiconductor such as $\alpha$-$Ga_2O_3$.

Also, $Ir_2O_3$ has been conventionally known, for example, to be used as an iridium catalyst as disclosed in PTL 4, and that PTL 5 discloses that $Ir_2O_3$ is used as a dielectric, and PTL 6 discloses that $Ir_2O_3$ is used as an electrode. However, $Ir_2O_3$ has never been known to be used as a p-type semiconductor, and recently, by the present applicant et al., the use of $Ir_2O_3$ as a p-type semiconductor has started to be studied and described in (Patent Document 7). Therefore, research and development of the p-type semiconductor has been progressing, and using enhanced semiconductor materials including gallium oxide ($Ga_2O_3$), semiconductor devices that are able to realize high withstand voltage, low losses, and high temperature resistance have been waiting.

CITATION LIST

Patent Literature

PTL 1: JP2005-340308A
PTL 2: JP2013-58637A
PTL 3: JP2016-25256A
PTL 4: JPH09-25255A
PTL 5: JPH08-227793A
PTL 6: JPH11-21687A
PTL 7: PCT international publication No. WO2018/043503A

Non Patent Literature

NPL 1: Kaneko, Kentaro, "Fabrication and physical properties of corundum structured alloys based on gallium oxide", Dissertation, Kyoto Univ., March 2013
NPL 2: Tatsuya, Takemoto, EE Times, Japan "power device gallium oxide" Thermal conductivity, p-type overcoming issues and putting it into practical use. [online], Retrieved Jun. 21, 2016, from http://eetimes.jp/ee/articles/1402/27/news028_2.html
NPL 3: F. P. KOFFYBERG et al., "OPTICAL BANDGAPS AND ELECTRON AFFINITIES OF SEMICONDUCTING $Rh_2O_3(I)$ and $Rh_2O_3(III)$", J. Phys. Chem. Solids Vol. 53, No. 10, pp. 1285-1288, 1992
NPL 4: Hideo Hosono, "Functional development of oxide semiconductor" Physics Research, Electronic version, Vol. 3, No. 1, 031211 (Combined in one volume of September 2013 and February 2014)

SUMMARY OF INVENTION

Technical Problem

The present inventive subject matter has an object to provide a semiconductor device that is useful as a power device, for example.

Solution to Problem

The present inventors made careful investigations to achieve the object above, and as a result of the present inventive subject matter, the inventors found that it is possible to suppress leakage current by an oxide film containing phosphorus being arranged on at least a part of an oxide semiconductor film, and conducted further investigations to complete the present inventive subject matter.

[1] A semiconductor device includes an inversion channel region, and the inversion channel region contains a crystal that has a corundum structure.
[2] A semiconductor device includes an inversion channel region; and an oxide semiconductor film containing a crystal that has a corundum structure at the inversion channel region.
[3] The semiconductor device according to [1] or [2], wherein the crystal is a mixed crystal.
[4] The semiconductor device according to any of [1] to [3], wherein the crystal is a p-type semiconductor.
[5] The semiconductor device according to any of [1] to [4], wherein the crystal contains a p-type dopant.
[6] The semiconductor device according to any of [1] to [5], further includes an oxide film that is arranged in contact with the inversion channel region.
[7] The semiconductor device according to [6], wherein the oxide film contains at least one element selected from elements of Group 15 in the periodic table.
[8] The semiconductor device according to [7], wherein the at least one element is phosphorus.
[9] The semiconductor device according to any of [6] to [8], wherein the oxide film further contains at least one element selected from elements of Group 13 in the periodic table.
[10] The semiconductor device according to any of [1] to [9], wherein the crystal has a corundum structure.
[11] The semiconductor device according to any of [1] to [10] further includes a first semiconductor region; and a second semiconductor region, and the inversion channel region is positioned between the first semiconductor region and the second semiconductor region in plan view.
[12] The semiconductor device according to any of [1] to [10] further includes a first semiconductor region with an upper surface; and a second semiconductor region with an upper surface, and the upper surface of the first semiconductor region and the upper surface of the second semiconductor region are flush with an upper surface of the inversion channel region.
[13] The semiconductor device according to [11] or [12], wherein the first semiconductor region is an n-type semiconductor region and the second semiconductor region is an n-type semiconductor region.
[14] The semiconductor device according to any of [11] to [13] further includes a third semiconductor region, and the third semiconductor region is positioned between the inversion channel region and the second semiconductor region in plan view.
[15] The semiconductor device according to [14], wherein the third semiconductor region is an n⁻-type semiconductor region.
[16] The semiconductor device according to any of [11] to [15] further includes a first electrode electrically connected to the first semiconductor region; and a second electrode electrically connected to the second semiconductor region.
[17] The semiconductor device according to any of [1] to [16], wherein the semiconductor device is a MOSFET.
[18] The semiconductor device according to any of [1] to [17], wherein the semiconductor device is a power device.
[19] A semiconductor system includes the semiconductor device according to any of [1] to [18].

Advantageous Effect of the Invention

A semiconductor device according to the present inventive subject matter is useful as a power device, for example.

DESCRIPTION OF EMBODIMENTS

Figure 1:
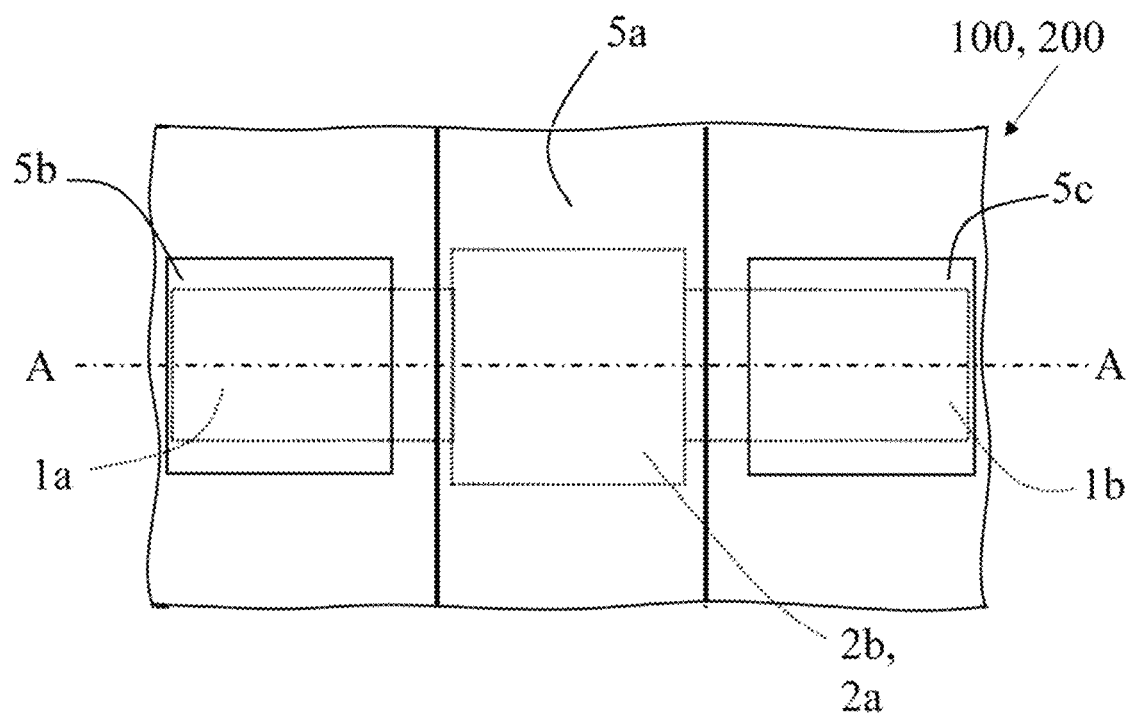
FIG. 1 shows a part of a schematic top plan view of a semiconductor device as an example of an inventive subject matter.

According to a semiconductor device as an aspect of an embodiment of the present inventive subject matter, the semiconductor device includes at least an inversion channel region, and an oxide semiconductor film containing a crystal that has a corundum structure at the inversion channel region.

The inversion channel region is not particularly limited, as long as an oxide semiconductor film containing a crystal that contains at least gallium oxide is used at the inversion channel region, and the oxide semiconductor film may be a p-type semiconductor film or an n-type semiconductor film. Examples of gallium oxide include $\alpha$-$Ga_2O_3$, $\beta$-$Ga_2O_3$, and $\epsilon$-$Ga_2O_3$, and particularly $\alpha$-$Ga_2O_3$ is preferable. Also, the crystal may be a mixed crystal. The mixed crystal of gallium oxide may be a mixed crystal of gallium oxide and one or two or more metal oxide(s). Preferable examples of the metal oxide include aluminum oxide, indium oxide, iridium oxide, rhodium oxide, and iron oxide. According to an aspect of a semiconductor device of a subject inventive matter, the crystal preferably contains gallium oxide as a major component. The term "major component" herein means that if an oxide semiconductor film contains $\alpha$-$Ga_2O_3$ as a major component, for example, the atomic ratio of gallium to entire metal components in the oxide semiconductor film is 0.5 or more, and according to a present inventive subject matter, the atomic ratio of gallium to entire metal components in the oxide semiconductor film is preferably 0.7 or more, and further preferably 0.8 or more. Also, even in a case that the crystal of an oxide semiconductor film is a mixed crystal, the oxide semiconductor film preferably contains gallium oxide as a major component. For example, in a case that an oxide semiconductor film contains $\alpha$-$(AlGa)_2O_3$ as a major component, for example, the atomic ratio of gallium to entire metal components in the oxide semiconductor film is 0.5 or more, and according to a present inventive subject matter, the atomic ratio of gallium to entire metal components in the oxide semiconductor film is preferably 0.7 or more, and further preferably 0.8 or more.

Also, a semiconductor device according to an aspect of an embodiment of the present inventive subject matter is a semiconductor device including an oxide semiconductor film containing a crystal with a corundum structure, and the oxide semiconductor film includes an inversion channel region. An oxide semiconductor film with a corundum structure usually contains a metal oxide as a major component, and examples of the metal oxide include gallium oxide, aluminum oxide, indium oxide, iridium oxide, rhodium oxide, and iron oxide. In the present inventive subject matter, the crystal preferably contains at least gallium oxide. The crystal may be a mixed crystal. The mixed crystal with a corundum structure containing at least gallium oxide, for example, further may contain at least one selected from among aluminum oxide, indium oxide, iridium oxide, rhodium oxide, and iron oxide. As described above, in an aspect of the semiconductor device of the present inventive subject matter, the major component of the oxide semiconductor film is preferably gallium oxide, and the crystal preferably has a corundum structure. Also, regarding the term "major component", the above description is referred to.

Also, the inversion channel region is usually a region contained in an oxide semiconductor film, and two or more inversion channel regions may be arranged in a semiconductor device as long as an object of the present inventive subject matter is not interfered with. Since the inversion channel region is a part of the oxide semiconductor film, the inversion channel region contains a crystal that contains at least gallium oxide, and contains the same major component as the major component contained in the oxide semiconductor film. When voltage is applied to a semiconductor device including the oxide semiconductor film, the inversion channel region that is a part of the oxide semiconductor film is inverted. For example, if the oxide semiconductor film is a p-type semiconductor film, the inversion channel region is inverted to be n-type. Also, the oxide semiconductor usually has a shape of film, and also may be a semiconductor layer. The thickness of the oxide semiconductor film is not particularly limited, and the oxide semiconductor film may be 1 $\mu$m or less in thickness, and may be 1 $\mu$m or more in thickness, however, according to the present inventive subject matter, the oxide semiconductor film is preferably 1 $\mu$m or more, and further preferably in a range of 1 $\mu$m to 40 $\mu$m, and most preferably in a range of 1 $\mu$m to 25 $\mu$m. The surface area of the oxide semiconductor film is not particularly limited, and may be 1 $mm^2$ or more, or 1 $mm^2$ or less. Also, the oxide semiconductor film is usually a single crystal, the oxide semiconductor film may be a polycrystal. Furthermore, the oxide semiconductor film may be a single-layer film, or may be a multilayer film.

The oxide semiconductor film preferably contains a dopant. The dopant is not particularly limited and may be a known dopant. The dopant may be an n-type dopant and examples of the n-type dopant include tin (Sn), germanium (Ge), silicon (Si), titanium (Ti), zirconium (Zr), vanadium (V), and niobium (Nb). Also, the dopant may be a p-type dopant and examples of the p-type dopant include magnesium (Mg), zinc (Zn), and calcium (Ca). The contained amount of dopant in the oxide semiconductor layer is preferably 0.00001 atomic percent (at. %) or more, and is more preferably in a range of 0.00001 at. % to 20 at. %, and most preferably in a range of 0.00001 at. % to 10 at. %.

According to embodiments of a present inventive subject matter, the oxide semiconductor film includes an inversion channel region. In a case that the oxide semiconductor film is a p-type semiconductor film, the inversion channel region of the oxide semiconductor film is preferably inverted to be n-type when a voltage is applied to the semiconductor device, and the p-type semiconductor film is preferably an oxide semiconductor film containing at least gallium oxide. According to embodiments of the present inventive subject matter, the oxide semiconductor film is preferably a p-type semiconductor film, and the oxide semiconductor film further preferably contains a p-type dopant. The p-type dopant is not particularly limited, and may be a known p-type dopant as long as the p-type dopant gives electrical conductivity to the oxide semiconductor film as a p-type semiconductor film. Examples of the p type dopant include magnesium (Mg), hydrogen (H), lithium (Li), natrium (Na), kalium (K), rubidium (Rb), cesium (Cs), fransium (Fr), beryllium (Be), calcium (Ca), strontium (Sr), barium (Ba), radium (Ra), manganese (Mn), iron (Fe), cobalt (Co), nickel (Ni), palladium (Pd), copper (Cu), silver (Ag), gold (Au), zinc (Zn), cadmium (Cd), mercury (Hg), thalium (Tl), lead (Pb), nitrogen (N), and phosphorus (P). According to the inventive subject matter, the p-type dopant is preferably magnesium (Mg), zinc (Zn) or calcium (Ca).

As illustrated in the figures submitted herewith, some aspects of embodiments of semiconductor devices of the present application are explained in detail. The drawings schematically represent semiconductor devices, and dimensions and dimension ratios of actual semiconductor devices may not necessarily coincide with dimensions and dimension ratios of the semiconductor devices in the drawings. Descriptions of the contents overlapping in embodiments may be omitted. Further, it should be noted that the technical scope of the present application is not limited to the embodiments described below, but extends to the description contents of the claims and their equivalents. Relative terms such as "upper" or "lower" or "below" or "above" may be used herein to describe a relationship of an element, region, or film (layer) with respect to another element, region, or film (layer) as illustrated in the figures, however, it will be understood that these terms are intended to encompass different orientations of devices in addition to the orientations depicted in the figures.

FIG. 1 shows a part of a schematic top plan view of a semiconductor device as an example of an inventive subject matter, and the number, shapes, and arrangements of electrodes are suitably selectable.

Figure 2:
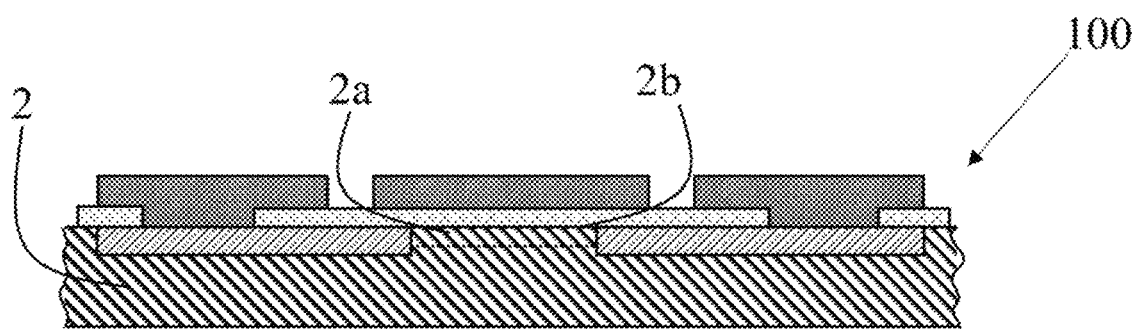
FIG. 2 is a cross-sectional view showing a first aspect of a semiconductor device of an inventive subject matter, and for example, an A-A cross sectional view of the semiconductor device shown in FIG. 1.

FIG. 2 is a cross-sectional view showing a first aspect of a semiconductor device of an inventive subject matter, and for example, an A-A cross sectional view of the semiconductor device shown in FIG. 1. The semiconductor device 100 includes an oxide semiconductor film 2 that contains a crystal containing at least gallium oxide. The oxide semiconductor film 2 includes an inversion channel region 2a. The crystal contains gallium oxide as a major component. The crystal may be a mixed crystal. The semiconductor device 100 includes an oxide film 2b that is arranged at a position where the oxide film 2b is in contact with the inversion channel region 2a.

Figure 3:
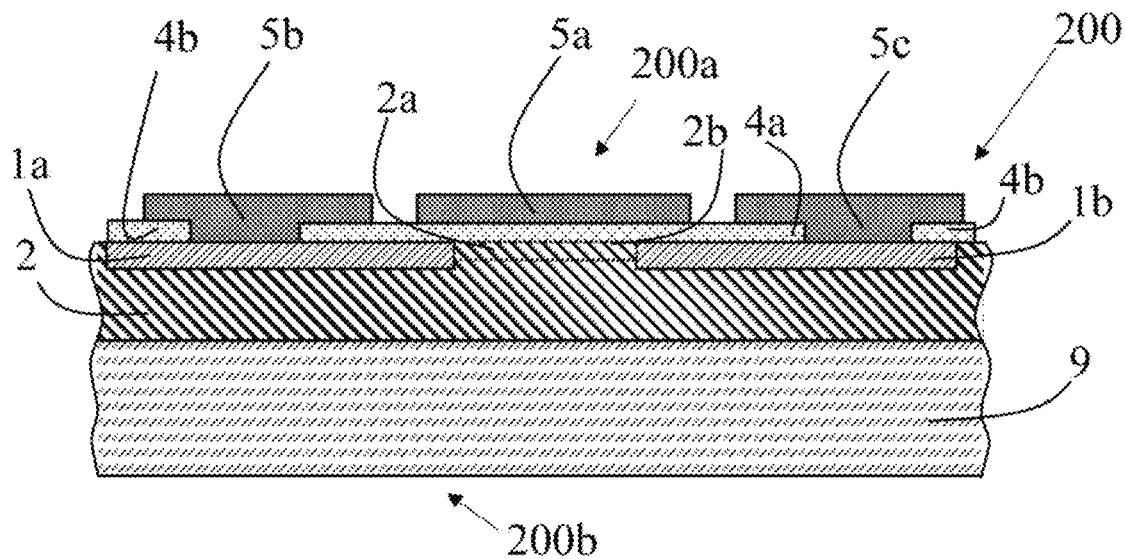
FIG. 3 is a cross-sectional view showing a second aspect of a semiconductor device of an inventive subject matter, and for example, an A-A cross sectional view of the semiconductor device shown in FIG. 1.

FIG. 3 is a cross-sectional view showing a second aspect of a semiconductor device of the present inventive subject matter. The semiconductor device 200 includes an oxide semiconductor film 2 that contains a crystal containing at least gallium oxide, and the oxide semiconductor film 2 includes an inversion channel region 2a. The crystal has a corundum structure. The semiconductor device 200 includes a first semiconductor region 1a and a second semiconductor region 1b. According to an aspect of an embodiment as shown in FIG. 1, the inversion channel region 2a being positioned between the first semiconductor region 1a and the second semiconductor region 1b in plan view. When voltage is applied to a semiconductor device 200, the inversion channel region of the oxide semiconductor film 2 is inverted and the first semiconductor region 1a and the second semiconductor region 1b are electrically connected. Further, in this embodiment, the first semiconductor region 1a and the second semiconductor region 1b are positioned in the oxide semiconductor film 2. The first semiconductor region 1a with an upper surface and the second semiconductor region 1b with an upper surface are arranged in the oxide semiconductor film 2 such that the upper surface of the first semiconductor region 1a and the upper surface of the second semiconductor region 1b are flush with an upper surface of the inversion channel region 2a. At a side of the first surface 200a of the semiconductor device 200, since the first semiconductor region 1a, the oxide semiconductor film 2 including the inversion channel region 2a, and the second semiconductor region 1b constitute a flat surface, it is easy to design the semiconductor device, for example, arrangement of electrodes, and it also leads to produce thinner semiconductor devices. Also, as shown below, in a case that the oxide semiconductor film 2 includes an oxide film 2b that is arranged in contact with the inversion channel region 2a2, the case is included in cases that the first semiconductor region 1a, the oxide semiconductor film 2 including the inversion channel region 2a, and the second semiconductor region 1b constitute a flat surface. The first semiconductor region 1a and the second semiconductor region 1b may be embedded in the oxide semiconductor film 2 or may be arranged in the oxide semiconductor film 2 by ion implantation. Also, the oxide semiconductor film 2 according to the present embodiment is a p-type semiconductor film, the first semiconductor region 1a and the second semiconductor region 1b are n-type semiconductor regions. The oxide semiconductor film 2 may contain a p-type dopant. Furthermore, the semiconductor device 200 may include an oxide film 2b that is arranged on the inversion channel region 2a. In embodiments of the present inventive subject matter, it is also preferable that the oxide film 2b has a crystalline structure of the trigonal system to which the corundum structure belongs. The oxide film 2b contains at least one element selected from elements of the Group 15 in the periodic table, and preferably contains phosphorus. Also, as another embodiment, the oxide film 2b may contain at least one element selected from elements of the Group 13 in the periodic table, the semiconductor device 200 includes a first electrode 5b that is electrically connected to the first semiconductor region 1a, and a second electrode 5c that is electrically connected to the second semiconductor region 1b. Also, the semiconductor device 200 has a third electrode 5a that is spaced away from the inversion channel region 2a by the insulation film 4a between the first electrode 5b and the second electrode 5c. Further, as shown in the figures, the first electrode 5b, the second electrode 5c, and the third electrode 5a are arranged at a side of the first surface 200a of the semiconductor device 200. Specifically, the semiconductor device 200 includes an insulation film 4a that is arranged on the oxide film 2b on the inversion channel region 2a, and the third electrode 5a is positioned on the insulation film 4a. Furthermore, in the semiconductor device 200, the first electrode 5b and the first semiconductor region 1a are electrically connected, however, the semiconductor device 200 may include an insulation film 4b that is partially positioned between the first electrode 5b and the first semiconductor region 1a. Furthermore, the second electrode 5c and the second semiconductor region 1b are electrically connected, however, the semiconductor device may have an insulation film 4b which is also partially positioned between the second electrode 5c and the second semiconductor region 1b. Furthermore, the semiconductor device 200 may include another layer at a side of the second surface 200b of the semiconductor device 200, i.e., the lower side of the oxide semiconductor film 2, and as shown in FIG. 3, the semiconductor device 200 may include a substrate 9. Also, as shown in FIG. 1, the first semiconductor region 1a includes a portion that overlaps the first electrode 5b and also includes a portion that overlaps the third electrode 5a in plan view. Also, the second semiconductor region 1b includes a portion that overlaps the second electrode 5c and also includes a portion that overlaps the third electrode 5a in plan view. According to an embodiment of a present inventive subject matter, when a positive voltage with respect to the first electrode 5b is applied to the third electrode 5a, the inversion channel region 2a of the oxide semiconductor film 2 is reversed from p-type to n-type to form an n-type channel layer, causing electrical connection of the first semiconductor region 1a and the second semiconductor region 1b and electrons flow from the source electrode to the drain electrode. Also, by setting the voltage of the third electrode 5b to zero, a channel layer is not formed at the inversion channel region 2a and thus, that results in a turn-off. In an aspect of the present embodiment, for example, the first electrode 5b may be a source electrode, the second electrode 5c may be a drain electrode, and the third electrode 5a may be a gate electrode. In this case, the insulation film 4a is a gate insulation film, and the insulation film 4b is a field insulation film.

Figure 4:
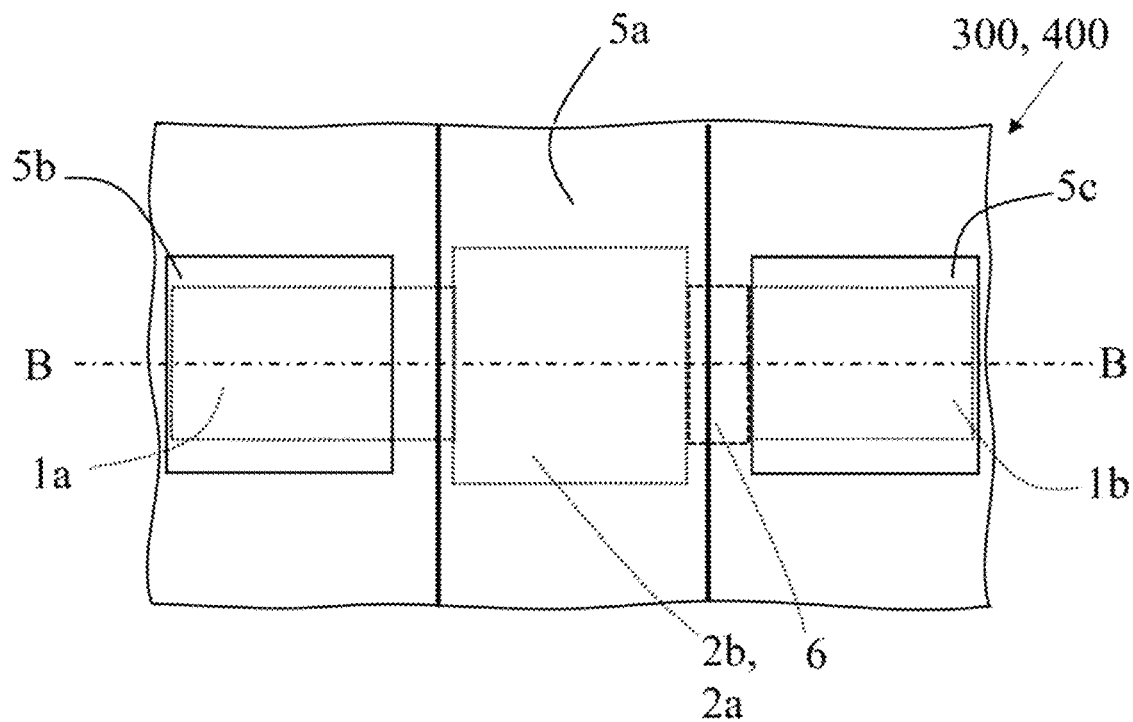
FIG. 4 shows a part of a schematic top plan view of a semiconductor device as an example of an inventive subject matter.

FIG. 4 shows a part of a schematic top plan view of a semiconductor device as an example of the present inventive subject matter, and the number, shapes, and arrangements of electrodes are suitably selectable.

Figure 5:
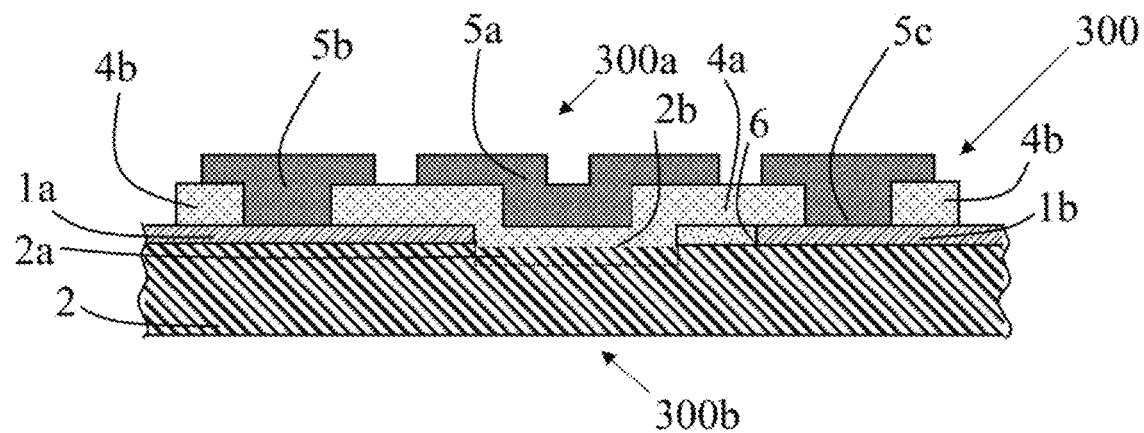
FIG. 5 shows a cross-sectional view showing a third aspect of a semiconductor device of an inventive subject matter, and for example, a B-B cross sectional view of the semiconductor device shown in FIG. 4.

FIG. 5 shows a cross-sectional view showing a third aspect of a semiconductor device according to the present inventive subject matter, and for example, may be a B-B cross sectional view of the semiconductor device shown in FIG. 4. The semiconductor device 300 includes an oxide semiconductor film 2 that contains a crystal containing at least gallium oxide. The crystal containing gallium oxide may be a mixed crystal. The crystal has a corundum structure. According to an aspect of this embodiment, the first semiconductor region 1a and the second semiconductor region 1b are arranged on the oxide semiconductor film 2. In this embodiment, the inversion channel region 2a is positioned between the first semiconductor region 1a and the second semiconductor region 1b in plan view, further an $n^-$-type semiconductor layer may be arranged as a third semiconductor region 6 between the inversion channel region 2a and the second semiconductor region 1b. By arranging the third semiconductor region 6 between the inversion channel region 2a and the second semiconductor region 1b, it is possible to achieve a high withstand voltage of the oxide semiconductor film 2 and semiconductor device 300. In addition, the semiconductor device 300 may include other layer(s). For example, the semiconductor device 300 may include an insulating layer at the side of the second surface 300b of the oxide semiconductor device 300, as shown in FIG. 5, and the side of the second surface 300b may further include other layer(s).

Figure 6:
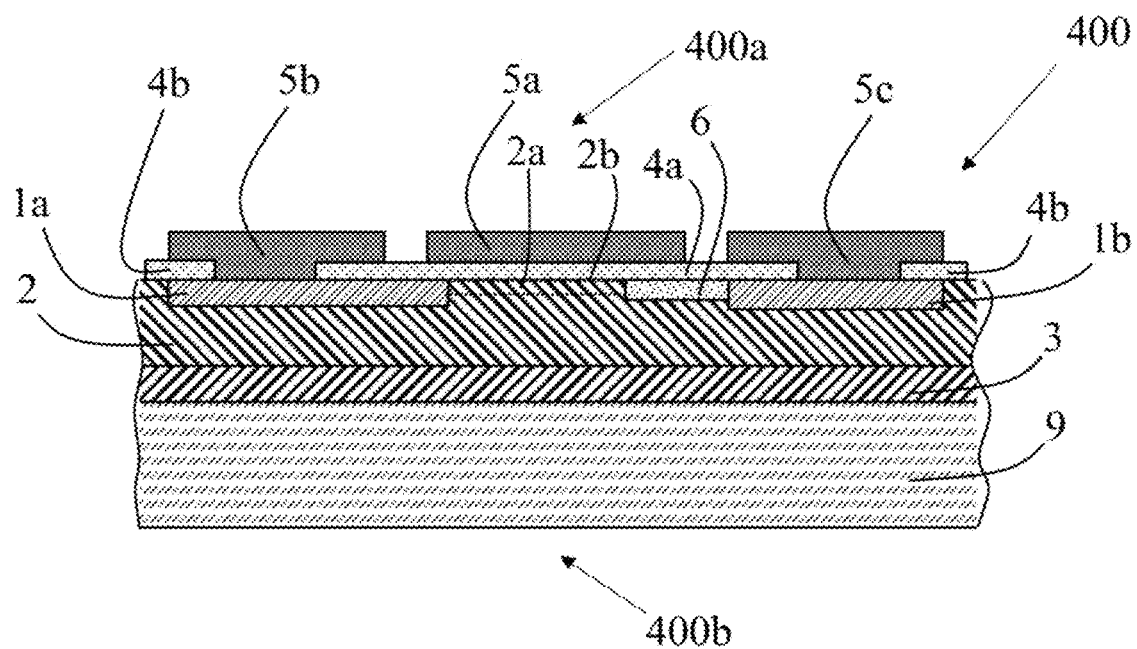
FIG. 6 shows a cross-sectional view showing a fourth aspect of a semiconductor device of an inventive subject matter, and for example, a B-B cross sectional view of the semiconductor device shown in FIG. 4.

FIG. 6 shows a cross-sectional view showing a semiconductor device according to a fourth aspect of the inventive subject matter, and for example, a B-B cross sectional view of the semiconductor device shown in FIG. 4. The semiconductor device 400 includes an oxide semiconductor film 2 containing a crystal that contains at least gallium oxide, and the oxide semiconductor film 2 includes an inversion channel region 2a. The crystal has a corundum structure. Also, the semiconductor device 400 includes a first semiconductor region 1a and a second semiconductor region 1b. In this embodiment, the inversion channel region 2a is positioned between the first semiconductor region 1a and the second semiconductor region 1b in plan view. Also, the upper surface of the first semiconductor region 1a and the upper surface of the second semiconductor region 1b are positioned in the oxide semiconductor film 2, and are arranged to be flush with at least a part of an upper surface of the oxide semiconductor film 1a. In this case, the upper surface of the oxide semiconductor film 2 may include an upper surface of the oxide film 2b. Furthermore, an $n^-$-type semiconductor layer 6 may be arranged between the inversion channel region 2a and the second semiconductor region 1b of oxide semiconductor film 2, and thus, the semiconductor device of this embodiment shows a structure, that can be expected to obtain high breakdown voltage as well as to be thinned. The semiconductor device further includes a substrate 9 and a metal oxide film 3 that is arranged on the substrate 9. The metal oxide film 3 contains gallium oxide and may contain gallium oxide as a major component. The metal oxide film 3 preferably has resistance higher than resistance of the oxide semiconductor film 2.

Figure 7:
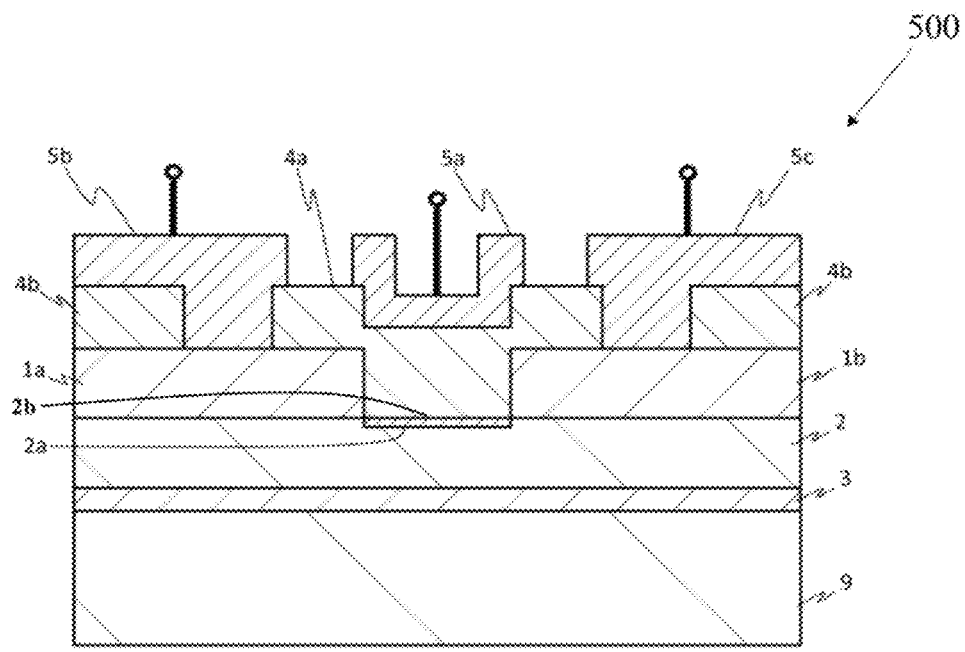
FIG. 7 shows a part of a cross-sectional view showing a fifth aspect of a semiconductor device of an inventive subject matter.

FIG. 7 shows a part of a cross-sectional view showing a fifth aspect of a semiconductor device according to the present inventive subject matter. The semiconductor device 500 includes an oxide semiconductor film 2 that contains a crystal containing at least gallium oxide, and the oxide semiconductor film 2 includes an inversion channel region 2a. Also, the semiconductor device 500 includes a first semiconductor region 1a and a second semiconductor region 1b. In this embodiment, the inversion channel region 2a is positioned between the first semiconductor region 1a and the second semiconductor region 1b in plan view. Also, the first semiconductor region 1a and the second semiconductor region 1b are arranged on the oxide semiconductor film 2. The semiconductor device further includes a substrate 9, and a metal oxide film 3 that is arranged on the substrate 9. The metal oxide film 3 contains gallium oxide, and may contain gallium oxide as a major component. The metal oxide film 3 preferably has resistance higher than resistance of the oxide semiconductor film 2. The semiconductor device shown in FIG. 7 is a MOSFET, in particular a planar MOSFET, and the oxide semiconductor film 2 is a p-type semiconductor film including an inversion channel region 2a on that an oxide film 2b containing phosphorus is formed. In this embodiment, the first semiconductor region 1a is an $n^+$-type semiconductor layer ($n^+$-type source layer). Also, the second semiconductor region 1b is an $n^+$-type semiconductor layer ($n^+$-type drain layer). Also, the first electrode 5b is a source electrode, the second electrode 5c is a drain electrode, and the third electrode 5a is a gate electrode.

Figure 11:
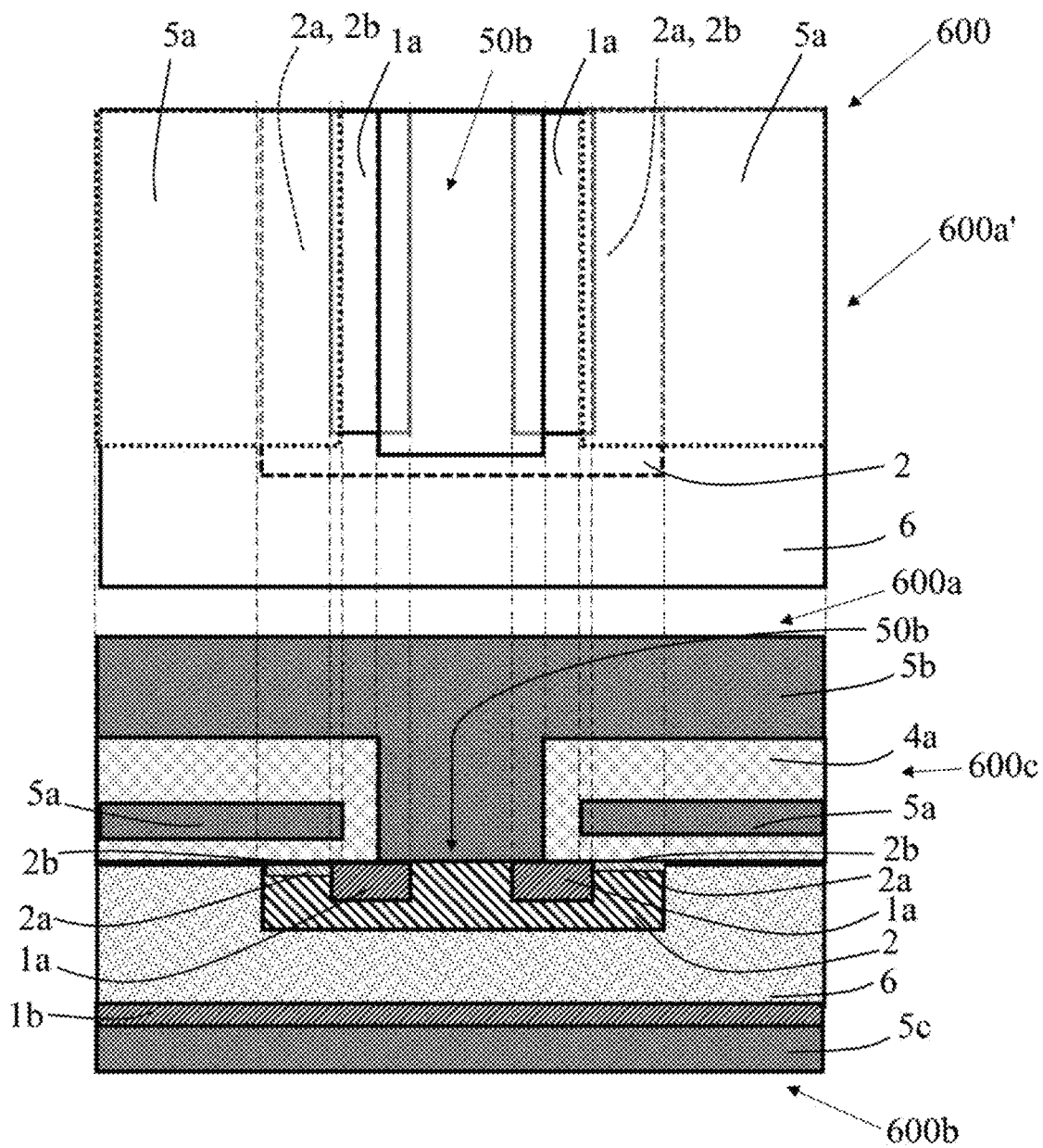
FIG. 11 shows a partial perspective view ($600a'$) of a vertical semiconductor device as an example of a semiconductor device according to the present inventive subject matter, viewed from the side of a first surface of the semiconductor device in a condition that a source electrode and a portion of an insulation layer under the source electrode are removed, and a partial cross-sectional view ($600c$) of the semiconductor device including the source electrode and the insulation layer under the source electrode at the side of the first surface of the semiconductor device.

FIG. 11 shows a partial perspective view (600a') of a vertical semiconductor device as an example of a semiconductor device according to the present inventive subject matter, viewed from the side of a first surface 600a of the vertical semiconductor device in a condition that a first electrode 5b and a portion of an insulation layer 4a under the first electrode 5b are removed, and a partial cross-sectional view (600c) of the semiconductor device 600. For easier understanding, the second semiconductor region 1b and the second electrode 5c that are positioned at a side of a second surface 600b are not shown in the partial perspective view 600a' viewed from the side of the first surface 600a but shown in the partial cross-sectional view 600c that also shows the first electrode 5b, the insulation layer 4a. The semiconductor device 600 of this embodiment shows a vertical device structure in that electrodes are arranged on the side of the first surface 600a and the side of the second surface 600b of semiconductor device 600. The semiconductor device 600 includes an oxide semiconductor film 2 that contains a crystal containing at least gallium oxide, and the oxide semiconductor film 2 includes an inversion channel region 2a and an oxide film 2b that is positioned in contact with the inversion channel region 2a. Furthermore, the semiconductor device 600 includes a first electrode 5b that is arranged on the side of the first surface of the oxide semiconductor film 2, a second electrode 5c that is arranged on the side of the second surface of the oxide semiconductor film 2, and a third electrode 5a that is at least partially positioned between the first electrode 5b and the second electrode 5c in cross-sectional view. Also, as shown in 600c of FIG. 11, the third electrode 5a is spaced away from the first electrode 5b by the insulation layer 4a, and is also spaced away from the second electrode 5c by two or more layers as shown in the figure. The semiconductor device in this embodiment is able to be used as a vertical MOSFET. For example, in a case that the oxide semiconductor film 2 is a p-type semiconductor film and includes an inversion channel region 2a on that an oxide film 2b containing phosphorus is arranged, the first electrode 5b is a source electrode, the second electrode 5c is a drain electrode, and the third electrode 5a is a gate electrode. Furthermore, the semiconductor device 600 includes a first semiconductor region 1a positioned in the oxide semiconductor film 2, at least a portion of the oxide semiconductor film 2 is embedded in the third semiconductor region 6, the second semiconductor region 1b that is arranged in contact with the second surface of the third semiconductor region 6, the second electrode 5c that is arranged in contact with the second semiconductor region 1b. Also, 50b shows a contact surface of the first electrode, that is partially in contact with the oxide semiconductor film 2 and the first semiconductor region 1a that is positioned in the oxide semiconductor film 2. The second electrode 5c is positioned on the side of the second surface 600b of the semiconductor device 600. In this embodiment, the first semiconductor region 1a is an n⁺-type semiconductor layer (n⁺-type source layer). Further, the second semiconductor region 1b is an n⁺-type semiconductor layer (n⁺-type drain layer). In this embodiment, the oxide semiconductor film 2 is a p-type semiconductor film, and includes an oxide film 2b that is in contact with the inversion channel region 2a and that contains phosphorus and is arranged at a position close to the third electrode 5a (gate electrode). This structure enables to suppress gate leakage current more efficiently. If the gate leakage current is suppressed, a problem in that gate leakage current interferes with a formation of an inversion channel region is solved and the semiconductor device 600 with enhanced semiconductor properties is obtainable. Also, as in the sixth embodiment, by arranging the first electrode (a source electrode) on the side of the first surface 600a of the semiconductor device and the second electrode (a drain electrode) on the side of the second surface 600b so that the semiconductor device is vertical, and the semiconductor device is able to be downsized, compared to a planar semiconductor device with one side (the side of the first surface 600a or the side of the second surface 600b) on that the first electrode (a source electrode) and the second electrode (a drain electrode) are arranged. In addition, if such a vertical semiconductor device is arranged together with other vertical device(s), circuit design is facilitated because the devices are same vertical devices.

By use of methods of epitaxial crystal growth to form a film, an oxide semiconductor film containing a crystal that contains gallium oxide and/or has a corundum structure is obtainable. The methods of epitaxial crystal growth are not particularly limited as long as an object of the present inventive subject matter is not interfered with, and a known method may be used. Examples of the method of epitaxial crystal growth include a chemical vapor deposition (CVD) method, a Metalorganic Chemical Vapor Deposition (MOCVD) method, a Metalorganic Vapor-phase Epitaxy (MOVPE) method, a mist CVD method, a mist epitaxy method, a Molecular Beam Epitaxy (MBE) method, a HVPE method, and a pulse growth method. According to embodiments of the present inventive subject matter, in a case that oxide semiconductor films are formed by epitaxial crystal growth, the mist CVD method or the mist epitaxy method is preferably used.

In the present inventive subject matter, the film-formation preferably includes turning a raw-material solution containing a metal into atomized droplets that are to be floated (forming atomized droplets), carrying the atomized droplets by use of carrier gas onto a base (carrying the atomized droplets), and causing thermal reaction of the atomized droplets adjacent to the base to form a film on the base (forming a film).

(Raw-Material Solution)

The raw-material solution is not particularly limited as long as the raw-material solution contains a metal as a raw material for film formation and is able to be atomized, and the raw material solution may contain an inorganic material and may contain an organic material. The metal may be a simple metal or may be a metal compound, and is not particularly limited as long as an object of the present inventive subject matter is not interfered with. Examples of the metal include gallium (Ga), Iridium (Ir), indium (In), rhodium (Rh), aluminum (Al), gold (Au), silver (Ag), platinum (Pt), copper (Cu), iron (Fe), manganese (Mn), nickel (Ni), palladium (Pd), cobalt (Co), ruthenium (Ru), chromium (Cr), molybdenum (Mo), tungsten (W), tantalum (Ta), zinc (Zn), lead (Pb), rhenium (Re), titanium (Ti), tin (Sn), gallium (Ga), magnesium (Mg), calcium (Ca) and zirconium (Zr), and one or two or more metals may be selected from the examples, however, according to the present inventive subject matter, the metal preferably contains one or two or more metal(s) selected from metals of Group 4 to Group 6 of the periodic table, further preferably contains at least gallium, indium, aluminum, rhodium, or iridium, and most preferably contains at least gallium. By use of such preferable metal(s), it is possible to form an epitaxial film suitably used for semiconductor devices.

In the present inventive subject matter, as the raw-material solution, those containing the metal(s) in the form of complex or salt dissolved or dispersed in an organic solvent or water are preferably used. Examples of the form of the complex include acetylacetonato complexes, carbonyl complexes, ammine complexes, and hydrido complexes. Examples of the form of the salt include organic metal salts (e.g., metal acetate, metal oxalate, metal citrate, etc.), metal sulfide salt, metal nitrate salt, metal phosphate salt, metal halide salt (e.g., metal chloride salt, metal bromide salt, metal iodide salt, etc.).

The solvent of the raw-material solution is not particularly limited, as long as an object of the present inventive subject matter is not interfered with. The solvent may be an inorganic solvent, such as water, or may be an organic solvent, such as alcohol, or may be a mixed solvent of the inorganic solvent and the organic solvent. According to the present inventive subject matter, the solvent preferably contains water.

To the raw-material solution, an additive, such as hydrohalic acid and an oxidant, may be mixed. Examples of the hydrohalic acid include hydrobromic acid, hydrochloric acid, and hydroiodic acid. Examples of the oxidant include: peroxides, such as hydrogen peroxide ($H_2O_2$), sodium peroxide ($Na_2O_2$), barium peroxide ($BaO_2$), and benzoyl peroxide ($(C_6H_5CO)_2O_2$; hypochlorous acid (HClO); perchloric acid; nitric acid; ozone water; organic peroxides, such as peracetic acid and nitrobenzene. The blending ratio of the additive is not particularly limited, however, is preferably, with respect to the raw material solution, in a range of 0.001 volume % to 50 volume %, and is more preferably, in a range of 0.01 volume % to 30 volume %.

The raw-material solution may contain a dopant. The dopant is not particularly limited as long as an object of the present inventive subject matter is not interfered with. Examples of the dopant include the n-type dopants and the p-type dopants, mentioned above. The dopant concentration, in general, may be approximately in a range of $1\times10^{16}/cm^3$ to $1\times10^{22}/cm^3$, or the dopant concentration may be set at low concentration of, for example, approximately $1\times10^{17}/cm^3$ or less. Also, according to the present inventive subject matter, the dopant may be contained to be at high concentration of approximately $1\times10^{20}/cm^3$ or more.

(Forming Atomized Droplets)

At the forming atomized droplets, a raw material solution containing a metal is adjusted, the raw material solution is atomized, and droplets that are atomized are floated, to generate atomized droplets. The blending ratio of the metal is not particularly limited, but is preferably, with respect to the raw material solution, in a range of 0.0001 mol/L to 20 mol/L. The method of atomization is not particularly limited as long as the raw material solution is able to be atomized, and a known method may by used, however, in the present inventive subject matter, a method of atomization using ultrasonic vibration is preferable. The atomized droplets used in the present inventive subject matter are floating in the space with the initial velocity that is zero are carriable as a gas, and the atomized droplets floating in the space are preferable to avoid damage caused by the collision energy without being blown like a spray. The size of droplets is not limited to a particular size, and may be a few mm, however, the size of atomized droplets is preferably 50 μm or less, and further preferably in a range of 1 μm to 10 μm.

(Carrying the Atomized Droplets)

In carrying the atomized droplets, the atomized droplets are carried by carrier gas onto a base member. The carrier gas is not particularly limited as long as an object of the present inventive subject matter is not interfered with. Preferable examples of the carrier gas include oxygen, ozone, and an inert gas (e.g., nitrogen, argon, etc.), and a reducing gas (e.g., hydrogen gas, forming gas, etc.). One or more carrier gas of the examples may be used, and a dilution gas (e.g., 10-fold dilution gas) may be used as a second carrier gas. Also, the carrier gas may be supplied from one or two or more locations. While the flow rate of the carrier gas is not particularly limited, however, the flow rate of the carrier gas may be preferably regulated to be 1 L/min or less, and further preferably in a range of 0.1 L/min. to 1 L/min.

(Forming a Film)

In forming a film, the atomized droplets are reacted to form a film on a base member. The reaction is not particularly limited as long as a film is formed from the atomized droplets by the reaction, however, according to the present inventive subject matter, a thermal reaction is preferable. The thermal reaction may function as long as the atomized droplets react by heat, and reaction conditions are not particularly limited as long as an object of the present inventive subject matter is not interfered with. Here, the thermal reaction is usually carried out at an evaporation temperature of the solvent or higher temperatures, however, the temperature range for the thermal reaction is not too high, and preferably carried out at a temperature 650° C. or less. Also, the thermal reaction may be carried out in any atmosphere and not particularly limited as long as an object of the present inventive subject matter is not interfered with. The thermal reaction may be carried out under a vacuum, a non-oxygen atmosphere, a reducing-gas atmosphere, and an oxygen atmosphere, and also under any conditions of atmospheric pressure, increased pressure, and reduced pressure, however, according to the present inventive subject matter, the thermal reaction is preferably carried out under an atmospheric pressure, because calculation of evaporation temperature is simpler and also apparatus and equipment are able to be simplified. The thickness of the film is able to be set by adjusting a film-formation time.

(Base Member)

The base member is not particularly limited as long as the base member is able to support a semiconductor film to be formed on the base member. The material for the base member is not particularly limited as long as an object of the present inventive subject matter is not interfered with, and the base member may be a known base member and may be of an organic compound, and may be of an inorganic compound. Examples of the shape of the base member include a plate shape, such as a flat plate and a disk, a fibrous shape, a rod shape, a cylindrical shape, a prismatic shape, a tubular shape, a spiral shape, a spherical shape, and a ring shape, and according to the present inventive subject matter, a substrate is preferable, according to the present inventive subject matter. The thickness of the substrate is not particularly limited in the present inventive subject matter.

The substrate is in a plate shape and is not particularly limited as long as the substrate becomes a support for the semiconductor film. The substrate may be an insulating substrate, a semiconductor substrate, a metal substrate, or an electrically-conductive substrate, however, the substrate is preferably an insulating substrate, and also the substrate is preferably a substrate having a metal film on a surface of the substrate. Examples of the substrate include a base substrate containing a substrate material with a corundum structure as a major component, a base substrate containing a substrate material with a β-gallia structure as a major component, and a base substrate containing a substrate material with a hexagonal structure as a major component, and the like. The "major component" herein means that a substrate material with a specific crystal structure mentioned above, with respect to the entire components of the substrate, is contained in the substrate to account for preferably 50% or more, more preferably 70% or more, and even more preferably 90% or more, and possibly 100% at an atomic ratio.

The substrate material is not particularly limited as long as an object of the present inventive subject matter is not interfered with, and may be a known substrate material. As the substrate material, a substrate containing a crystal with a corundum structure at least on a surface of the substrate may be used. Examples of the substrate material with a corundum structure include $\alpha$-$Al_2O_3$, $\alpha$-$Ga_2O_3$, and a mixed crystal with a corundum structure containing at least gallium. As examples of the substrate with a corundum structure, $\alpha$-$Al_2O_3$(sapphire substrate) and $\alpha$-$Ga_2O_3$ substrate are preferable, and further preferable examples include an α-plane sapphire substrate, an m-plane sapphire substrate, an r-plane sapphire substrate, a c-plane sapphire substrate, and α-phase gallium oxide substrates (e.g., an α-plane, m-plane, or r-plane). Also, examples of the substrate material with a β-gallia structure include $\beta$-$Ga_2O_3$ substrate, and a substrate of mixed crystal containing $Ga_2O_3$ and $Al_2O_3$ in a condition that $Al_2O_3$ is more than 0 wt % and 60 wt % or less. Examples of the base substrate containing a substrate material with a hexagonal structure as a major component include a SiC substrate, a ZnO substrate, and a GaN substrate.

In the present inventive subject matter, after a film is formed, annealing may be carried out. The annealing temperature is not particularly limited as long as an object of the present inventive subject matter is not interfered with, and is generally carried out at a temperature in a range of 300° C. to 650° C. and preferably in a range of 350° C. to 550° C. The annealing time is generally in a range of 1 minute to 48 hours, preferably in a range of 10 minutes to 24 hours, and more preferably in a range of 30 minutes to 12 hours. The annealing may be carried out in any atmosphere as long as an object of the present inventive subject matter is not interfered with, and preferably in a non-oxygen atmosphere and more preferably in a nitrogen atmosphere.

Also, in the present inventive subject matter, the semiconductor film may be formed directly on the base member or may be provided on another layer, such as a buffer layer and a stress relief layer, arranged on the base member. The method of forming each of layers is not particularly limited, and may be a known method, however, in the present inventive subject matter, a mist CVD method or a mist epitaxy method is preferable.

With reference to the figure, a film (layer)-formation apparatus 19 suitably used for a method such as the mist CVD method or the mist epitaxy method is explained. The film (layer)-formation apparatus 19 includes a carrier gas supply device 22_a_, a flow-control valve 23_a_ to control a flow rate of carrier gas sent from the carrier gas supply device 22_a_, a carrier gas (dilution) supply device 22_b_, a flow-control valve 23b to control a flow rate of carrier gas (dilution) sent from the carrier gas (dilution) supply device 22b, a mist generator 24 in that a raw material solution 24a is contained, a vessel 25 in that water 25a is contained, an ultrasonic transducer 26 attached to a bottom of the vessel 25, a film (layer)-formation chamber 30, and a supply tube 27 of quartz connecting the mist generator 24 and the film (layer)-formation chamber 30, and a hot plate (heater) 28 placed in the film (layer)-formation chamber 30. A substrate 20 is placed on the hot plate 28.

Figure 15:
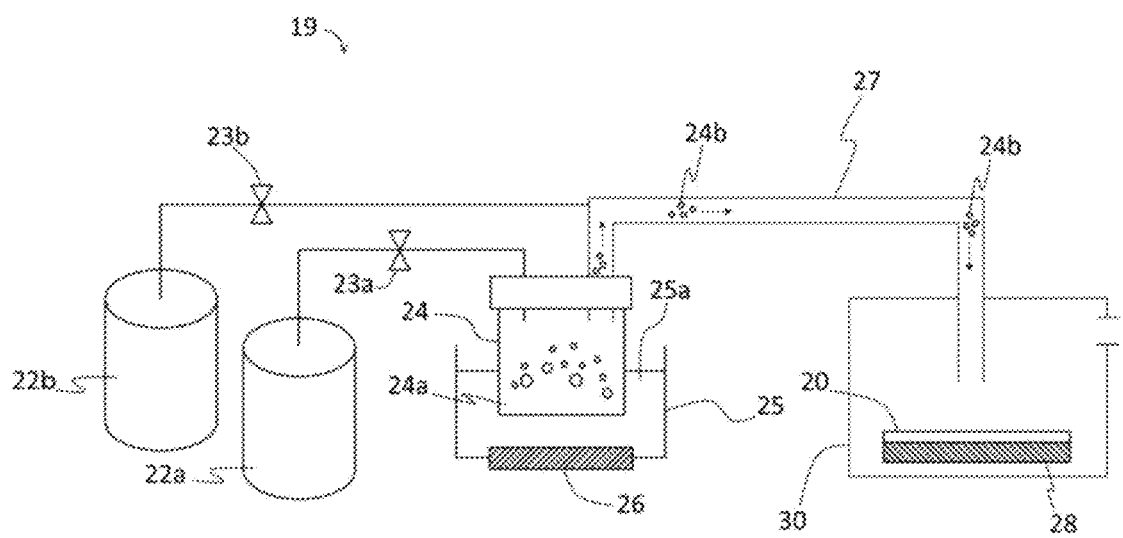
FIG. 15 shows a schematic diagram of a film (layer)-formation apparatus (a mist CVD apparatus) used according to an embodiment of a method.

As shown in FIG. 15, the raw-material solution 24a is stored in the mist generator 24, and a substrate 20 is placed on the hot plate 28, and the hot plate is activated to increase the temperature in the film (layer)-formation chamber 30. Next, the flow control valves 23 (23a and 23b) are opened to supply carrier gas from the carrier gas supply devices 22 (22a and 22b) into the film (layer)-formation chamber 30. After the atmosphere in the film (layer) formation chamber 30 is sufficiently replaced with the carrier gas, the flow rate of the carrier gas and the flow rate of carrier gas (dilution) are respectively adjusted. The ultrasonic transducer 26 is activated to vibrate and the vibrations propagate through the water 25a to the raw material solution 24a, thereby atomizing the raw material solution 24a to produce the atomized droplets 24b. The atomized droplets 24b are introduced into the film (layer)-formation chamber 30 by carrier gas and carried onto the substrate 20, and under atmospheric pressure, the atomized droplets 24b are thermally reacted in the film (layer)-formation chamber 30 to form a film on the substrate 20.

In the present inventive subject matter, the film obtained at the forming a film may be used in the semiconductor device as it is, also, the film after using a known method to separate from the substrate may be applied to the semiconductor device.

Also, the oxide semiconductor film that is a p-type semiconductor film preferably used in the present inventive subject matter, for example, is obtainable by a p-type dopant and hydrobromic acid that are added to the raw material solution that contains a metal, by the mist CVD method. Here, it is essential to add hydrobromic acid as an additive to the raw material solution. Furthermore, each procedure of the mist CVD method and conditions in each procedure and condition may be the same as those in the above-mentioned procedures such as Forming atomized droplets, Carrying the atomized droplets, and Forming a film. The p-type semiconductor film thus obtained is also good in pn junction with n-type semiconductor, and is suitably used for the inversion channel region.

The inversion channel region is typically provided between semiconductor regions with electrical conductivity that is different. For example, in a case that the inversion channel region is provided in the p-type semiconductor layer that is typically provided between the semiconductor regions of n-type semiconductor. Also, in a case that the inversion channel region is provided in the n-type semiconductor layer, the n-type semiconductor layer is typically provided between the semiconductor regions of p-type semiconductor. Also, the method of forming each semiconductor region may be the same as the method described above.

Also, in the present inventive subject matter, an oxide film containing at least one element selected from elements of the Group 15 in the periodic table is preferably arranged on the inversion channel region. As the element, examples of the element include nitrogen (N) and phosphorus (P), and according to the present inventive subject matter, nitrogen (N) or phosphorus (P) is preferable, and phosphorus (P) is more preferable. For example, an oxide film containing at least phosphorus, that is positioned between the gate insulation film and the inversion channel region and arranged on the inversion channel region, prevents hydrogen from diffusing into the oxide semiconductor film, and since it is also possible to lower interface state, a semiconductor device, especially a semiconductor device with a wide band gap semiconductor, is able to obtain an enhanced semiconductor characteristic. In the present inventive subject matter, the oxide film further preferably contains at least one of the elements of the Group 15 in the periodic table and one or two or more metals of the Group 13 of the periodic table. Examples of the metal include aluminum (Al), gallium (Ga), and indium (In), and particularly, Ga and/or Al is preferable, and Ga is further preferable. Also, the oxide film is preferably a thin film to be 100 nm or less in thickness, and most preferably a film that is 50 nm or less in thickness. The arrangement of such an oxide film makes it possible to further effectively suppress the gate leakage current and to obtain further enhanced semiconductor characteristics. As a method of forming the oxide film, for example, a known method may be used, and more specifically, examples of the method include a dry method and a wet method, however, surface treatment by phosphoric acid, for example, on the inversion channel region is preferable.

Further, according to the present inventive subject matter, if necessary, a gate electrode may be provided through a gate insulation film on and/or above the inversion channel region and the oxide film. The gate insulation film is not particularly limited as long as an object of the present inventive subject matter is not interfered with, and may be a known insulation film. As the gate insulation film, preferable examples include films of $SiO_2$, $Si_3N_4$, $Al_2O_3$, GaO, AlGaO, InAlGaO, AlInZnGaO$_4$, AlN, $Hf_2O_3$, SiN, SiON, MgO, and GdO, and oxide film (e.g., an oxide film containing at least phosphorus). The method of forming the gate insulation film may be a known method, and examples of the known method include a dry method and a wet method. Examples of the dry method include known methods such as sputtering, vacuum deposition, CVD (Chemical Vapor Deposition), ALD (Atomic Laser Deposition), and PLD (Pulsed Laser Deposition). Examples of the wet method include a method of application such as screen printing or die coating.

The gate electrode may be a known gate electrode, and material(s) of the electrode may be an electrically-conductive inorganic material, and also may be an electrically-conductive organic material. In the present inventive subject matter, the material(s) of the electrode is preferably a metal, and the metal is not particularly limited, however, at least one metal selected from metals of Group 4 to Group 11 in the periodic table. Examples of the metal of the Group 4 in the periodic table include titanium (Ti), zirconium (Zr), and hafnium (Hf), and particularly, Ti is preferable. Examples of the metal of Group 5 in the periodic table include vanadium (V), niobium (Nb), and tantalum (Ta). Examples of the metal of Group 6 in the periodic table include chromium (Cr), molybdenum (Mo), and tungsten (W), and one or two or more metals may be selected from, however, in the present inventive subject matter, Cr is more preferable because semiconductor properties including a switching characteristic become better. Examples of the metal of Group 7 in the periodic table include manganese (Mn), technetium (Tc), and Rhenium (Re). Examples of the metal of Group 8 in the periodic table include iron (Fe), ruthenium (Ru), and osmium (Os). Examples of the metal of Group 9 in the periodic table include cobalt (Co), rhodium (Rh), and iridium (Ir). Also, examples of the metal of Group 10 in the periodic table include nickel (Ni), palladium (Pd), and platinum (Pt), and particularly, Pt is preferable. Examples of the metal of Group 11 in the periodic table include copper (Cu), silver (Ag), and gold (Au). The method of forming the gate electrode may be, for example, a known method, and more specifically, examples of the method include a dry method and a wet method. As the dry method, for example, sputtering, vacuum deposition, or CVD may be mentioned as a known method. As the wet method, for example, screen printing or die coating may be mentioned.

In the present inventive subject matter, not only the gate electrode, but usually a source electrode and a gate electrode are provided, and similarly to the gate electrode, the source electrode and the gate electrode may be known electrodes, respectively, and may be formed by use of known methods, respectively.

The semiconductor device is particularly useful for power devices. As the semiconductor device, for example, a transistor may be named, and the semiconductor device is particularly suitable for a MOSFET.

Figure 12:
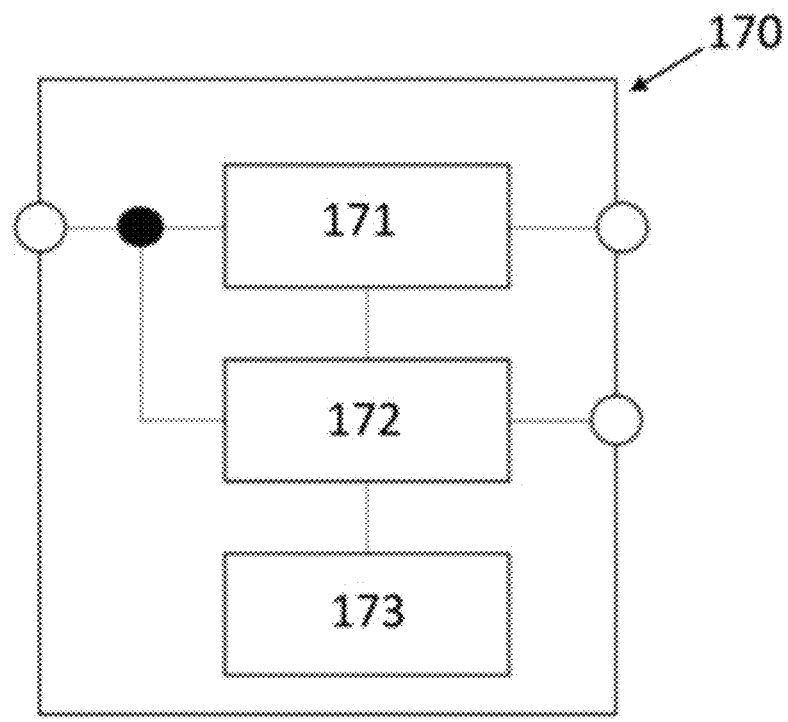
FIG. 12 shows a schematic view of a power system as a preferable example.
Figure 13:
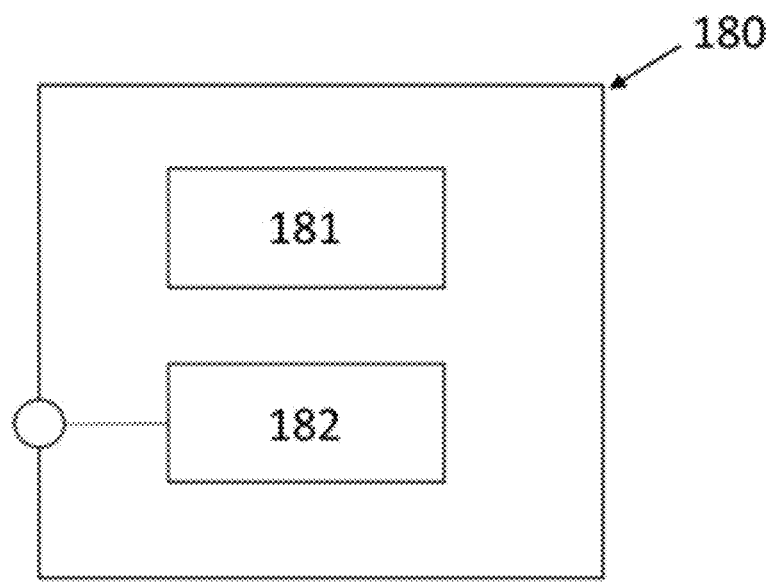
FIG. 13 shows a schematic view of a system device as a preferable example.

A semiconductor device according to the present inventive subject matter is, provided with the mentioned above, able to be suitably useful as a power module, inverter, or converter, using further known methods, and is also suitably used in, for example, semiconductor systems using a power device. The power device can be obtained from the semiconductor device or obtained as a semiconductor device by connecting the semiconductor device to wiring patterns by using a known method, for example. FIG. 12 shows a power system 170 including two or more power devices 171, 172, and a control circuit 173. The power system 170, as shown in FIG. 13, may be combined with an electric circuit 181 and a power system 182 for a system device 180.

Figure 14:
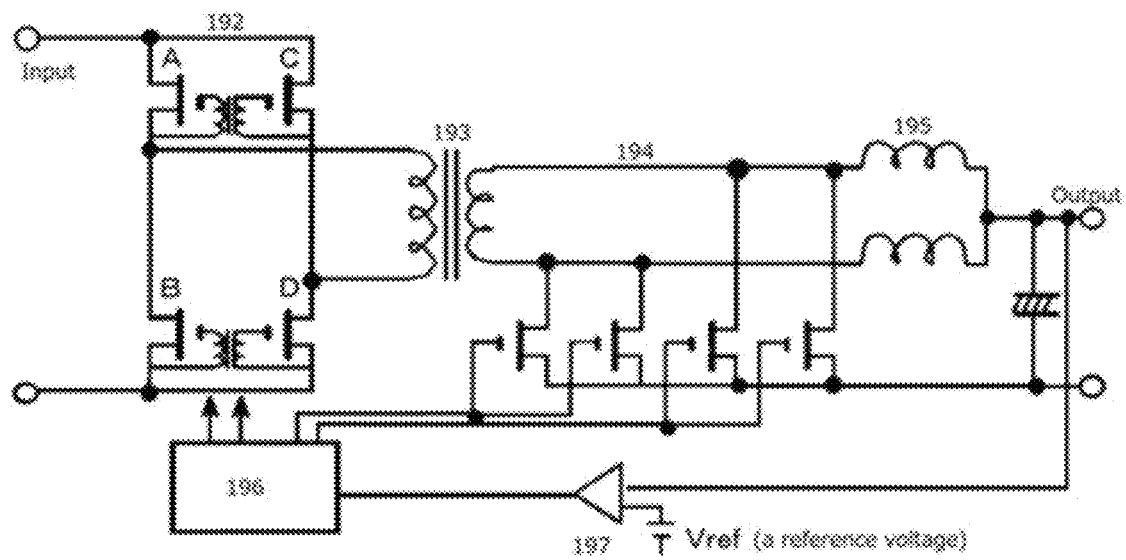
FIG. 14 shows a schematic view of a power source circuit of power source device as a preferable example.

FIG. 14 shows a schematic view of a power source circuit of a power source device. FIG. 14 illustrates a power supply circuit of a power device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFET (A~B') and then smoothed by a DCL 195 (smoothing coils L1 and L2) and a capacitor to output a direct current voltage. At this point, the output voltage is compared with a reference voltage by a voltage comparator 197 to control the inverter and the rectification MOSFET 194 by a PWM control circuit 196 to have a desired output voltage.

Figure 8:
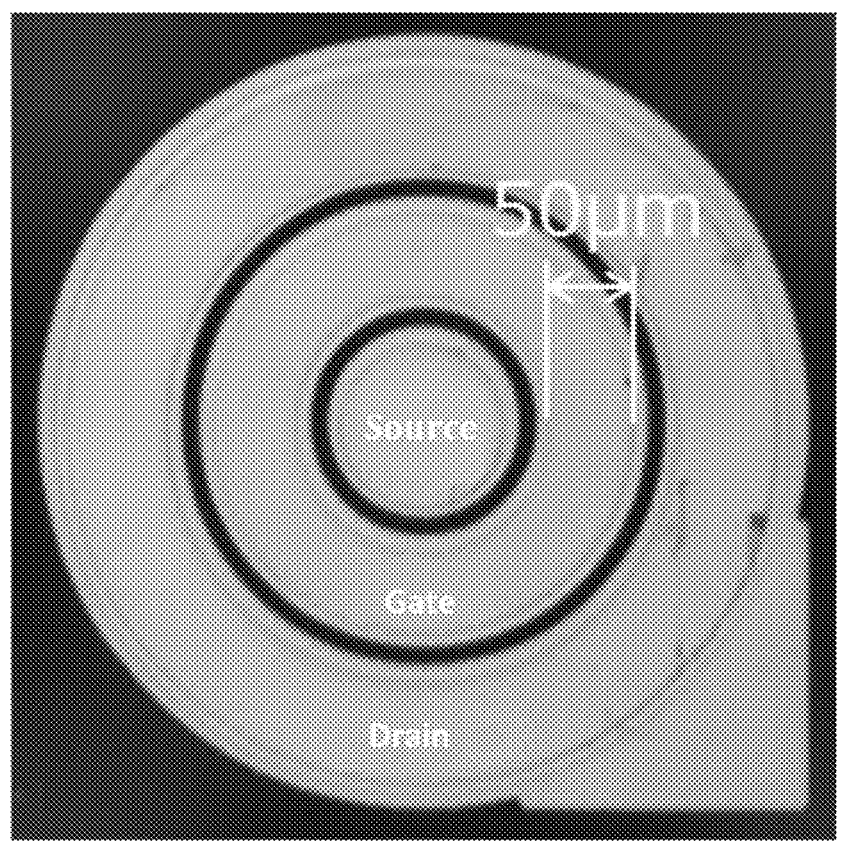
FIG. 8 shows a picture of a MOSFET made according to the fifth aspect, shown from above.

(Example 1) A MOSFET shown in FIG. 7 was made.
1. Forming a p-Type Semiconductor Layer
1-1. Film (Layer)-Formation Apparatus The film (layer)-formation apparatus 19 shown in FIG. 15 was used.
1-2. Preparing a Raw-Material Solution A raw-material solution was prepared by hydrobromide acid that is contained to be 20% by volume ratio in an aqueous solution of 0.1M gallium bromide, and also Mg that is added in the aqueous solution to be 1 volume %.
1-3. Film (Layer)-Formation Preparation The raw-material solution 24a obtained at 1-2. above was set in a container of the mist generator 24. Then, a sapphire substrate with a surface on that a non-doped α-Ga$_2$O$_3$ film is formed was placed as a substrate 20 on the hot plate (heater) 28, and the heater 28 was activated to raise the temperature in the film-formation chamber 30 up to 520° C. Next, the flow-control valves 23a, 23b were opened to supply carrier gas from the carrier gas supply device 22a and the carrier gas (dilution) supply device 22b, which are the source of carrier gas, into the film-formation chamber 30 to replace the atmosphere in the film-formation chamber 30 with the carrier gas sufficiently, and then, the flow rate of the carrier gas was regulated at 1 L/min. and the carrier gas (dilution) was regulated at 1 L/min. In this embodiment, nitrogen was used as the carrier gas.
1-4. Formation of a Semiconductor Film The ultrasonic transducer 26 was then activated to vibrate at 2.4 MHz, and vibrations were propagated through the water 25a to the raw material solution 24a to turn the raw material solution 24a into atomized droplets. The atomized droplets were introduced in the film-formation chamber 30 with the carrier gas, and introduced in the film (layer)-formation chamber 30 and reacted under atmospheric pressure at 520° C. to be formed into a semiconductor film on the substrate 20. The film thickness was 0.6 μm and the film-formation time was 15 minutes.
1-5. Evaluation The film obtained at 1-4. was evaluated by use of the X-ray diffraction (XRD) analysis device, and the film was found to be a film of α-Ga$_2$O$_3$.
2. Forming an n$^+$-Type Semiconductor Region An n$^+$-type semiconductor film was formed on the p-type semiconductor layer that was obtained at the above 1. by the same conditions as the conditions of the forming the p-type semiconductor layer obtained at the above 1. except the following conditions: a raw-material solution was prepared by hydrobromide acid that is contained to be 10% by volume ratio in an aqueous solution of 0.1M gallium bromide and also tin bromide that is contained to be 8% by volume ratio in the aqueous solution; the film-formation temperature was set to 580° C., and the film-formation time was set to five minutes. The film that was obtained was evaluated by use of the X-ray diffraction (XRD) analysis device, and the film was found to be a film of α-Ga$_2$O$_3$.
3. Forming an Insulation Film and Each Electrode The n$^+$-type semiconductor layer was etched with phosphoric acid at a region corresponding to the gate portion (between 1a and 1b), and furthermore, after treatment with phosphoric acid so that an oxide film containing at least phosphorus is formed on the semiconductor film, and then, a film of SiO$_2$ was formed by sputtering. Also, through treatment of photolithography, etching, and electron-beam evaporation, a MOSFET as shown in FIG. 7 was obtained. For each electrode, Ti was used. FIG. 8 shows a picture of a MOSFET, taken from above for reference.
(Evaluation)

Figure 9:
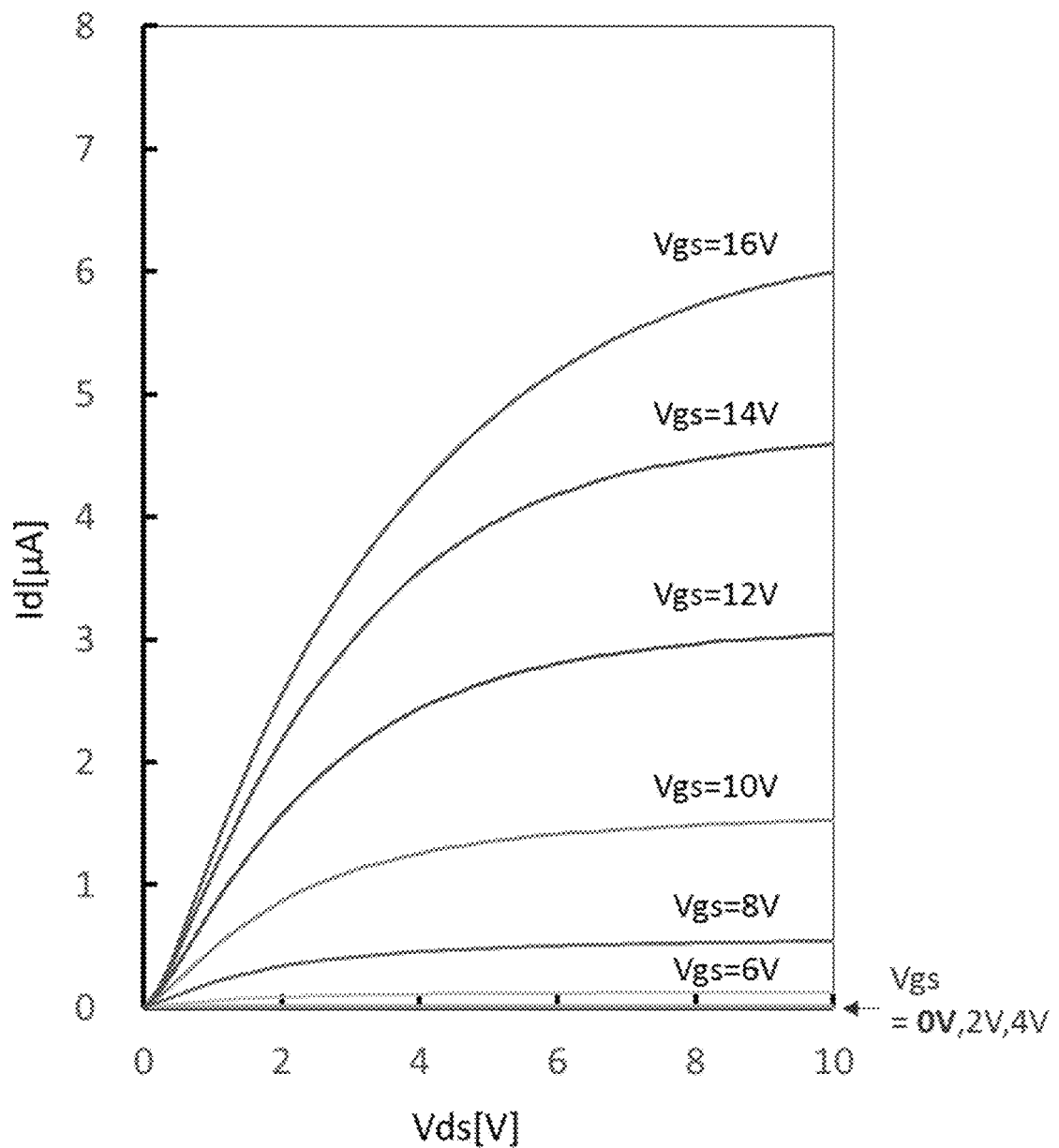
FIG. 9 shows a result of current-voltage (IV) measurement of the semiconductor device made according to the fifth aspect.
Figure 10:
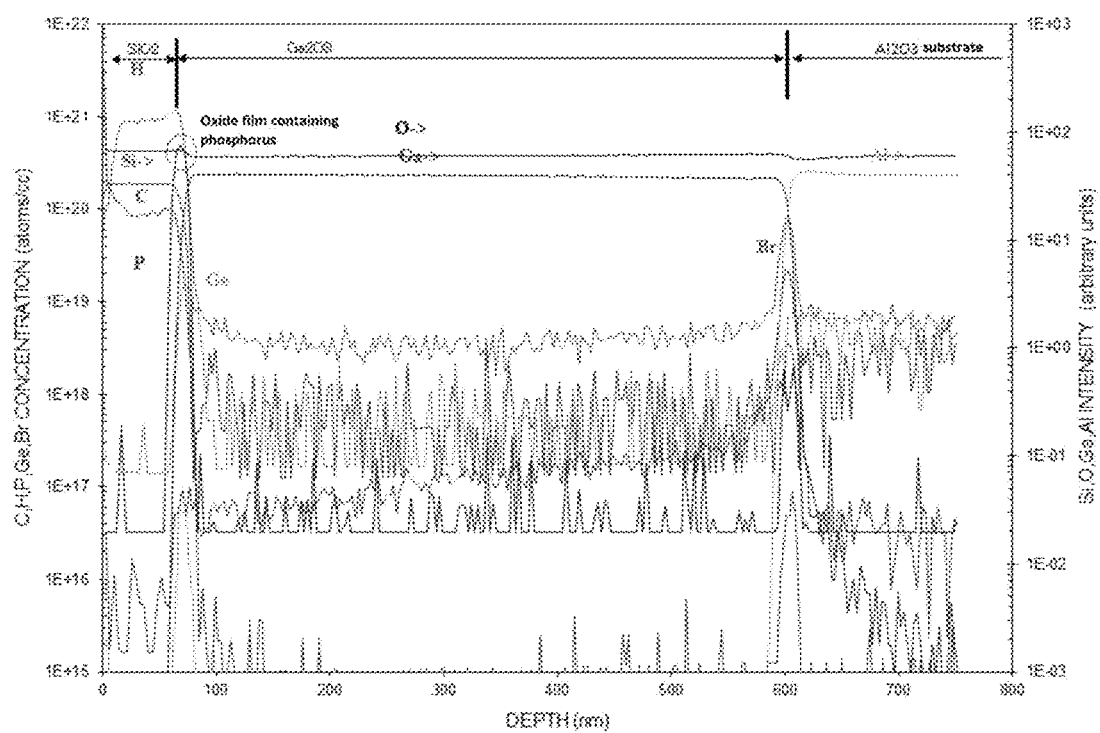
FIG. 10 shows a secondary-ion mass spectrometry (SIMS) measurement result of the semiconductor device made according to the fifth aspect.

IV measurement was carried out on the MOSFET that was obtained. FIG. 9 shows the result of IV measurement. As is apparent from FIG. 9, an inversion-channel region was formed, and it was demonstrated for the first time in the world that the MOSFET of gallium oxide semiconductor functions as a transistor. Then, the gate threshold voltage obtained from the IV characteristics was 7.9V. Also, at the above 3, SIMS measurement was performed to confirm whether an oxide film containing at least phosphorus is formed between the p-type semiconductor layer and the gate insulation film (that is the film of SiO$_2$). FIG. 10 shows the result of SIMS measurement. Based on FIG. 10, it can be seen that an oxide film containing phosphorus is formed between the p-type semiconductor layer and the gate insulation film, and furthermore, that it can be seen that the oxide film containing phosphorus prevents hydrogen in the gate insulation film from diffusing into the p-type semiconductor layer effectively.

INDUSTRIAL APPLICABILITY

A semiconductor device according to the present inventive subject matter is applicable to a wide variety of fields, such as semiconductors (e.g., compound semiconductor electronic devices, etc.), electronic and electrical components, optical and electronic photograph related devices, and industrial parts, and particularly useful for power devices.

REFERENCE NUMBER DESCRIPTION 1a a first semiconductor region
1b a second semiconductor region
2 an oxide semiconductor film
2a an inversion channel region
2b an oxide film
2c a second surface of the oxide semiconductor film
3 a metal oxide film
4a an insulation layer
5a a third electrode
5b a first electrode
5c a second electrode
6 a third semiconductor region
9 a substrate
19 a film (layer)-formation apparatus
20 a substrate
22a a carrier gas supply device
22b a carrier gas (dilution) supply device
23a a flow control valve of carrier gas
23b a flow control valve of carrier gas
24 a mist generator
24a a raw material solution
25 a vessel
25a water
26 an ultrasonic transducer
27 a supply tube
28 a heater
29 an exhaust port
50b a contact surface of the first electrode
100 a semiconductor device
170 a power system
171 a power device
172 a power device
173 a control circuit
180 a system device
181 an electric circuit
182 a power system
192 an inverter
193 a transformer
194 MOSFET
195 a DCL
196 a PWM control circuit
197 a voltage comparator
200 a semiconductor device
300 a semiconductor device
400 a semiconductor device
500 a semiconductor device
600 a semiconductor device

What is claimed is:

1. A semiconductor device comprising:
a first electrode;
a second electrode;
a gate electrode;
an inversion channel region; and
an oxide semiconductor film comprising a crystal that has a corundum structure,
the inversion channel region being only in the oxide semiconductor film,
wherein when a voltage is applied to the gate electrode, a conductivity type of the inversion channel region is inverted and electrons flow from the first electrode to the second electrode, and
wherein the crystal is a p-type semiconductor.

2. The semiconductor device according to claim 1, wherein the crystal is a mixed crystal.

3. The semiconductor device according to claim 1, further comprising:
an oxide film that is arranged in contact with the inversion channel region.

4. The semiconductor device according to claim 3, wherein the oxide film comprises at least one element selected from elements of Group 15 in the periodic table.

5. The semiconductor device according to claim 4, wherein the at least one element is phosphorus.

6. The semiconductor device according to claim 4, wherein the oxide film further comprises at least one element selected from elements of Group 13 in the periodic table.

7. The semiconductor device according to claim 1, wherein the crystal comprises gallium oxide as a major component.

8. The semiconductor device according to claim 1, further comprising:
a first semiconductor region; and
a second semiconductor region,
the inversion channel region being positioned between the first semiconductor region and the second semiconductor region in plan view.

9. The semiconductor device according to claim 8, wherein the first semiconductor region is an n-type semiconductor region and the second semiconductor region is an n-type semiconductor region.

10. The semiconductor device according to claim 9, further comprising:
a third semiconductor region,
the third semiconductor region being positioned between the inversion channel region and the second semiconductor region in plan view.

11. The semiconductor device according to claim 10, wherein the third semiconductor region is an n$^-$-type semiconductor region.

12. The semiconductor device according to claim 8, further comprising:
a first electrode electrically connected to the first semiconductor region; and
a second electrode electrically connected to the second semiconductor region.

13. The semiconductor device according to claim 12, wherein the first semiconductor region is an n-type semiconductor region and the second semiconductor region is an n-type semiconductor region.

14. The semiconductor device according to claim 12, further comprising:
a third semiconductor region,
the third semiconductor region being positioned between the inversion channel region and the second semiconductor region in plan view.

15. The semiconductor device according to claim 1, wherein the semiconductor device is a MOSFET.

16. A semiconductor system comprising:
the semiconductor device according to claim 1.

17. A semiconductor device comprising:
a first electrode;
a second electrode;

a gate electrode;

an n-type semiconductor layer; and an oxide semiconductor film comprising a crystal that has a corundum structure and an inversion channel region, the oxide semiconductor film arranged on the n-type semiconductor layer, wherein when a voltage is applied to the gate electrode, a conductivity type of the inversion channel region is inverted and electrons flow from the first electrode to the second electrode, and wherein the crystal is a p-type semiconductor.

18. The semiconductor device according to claim 17, wherein the crystal comprises a p-type dopant.

19. The semiconductor device according to claim 17, further comprising:

a first semiconductor region with an upper surface; and a second semiconductor region with an upper surface, the upper surface of the first semiconductor region and the upper surface of the second semiconductor region being flush with an upper surface of the inversion channel region.

20. The semiconductor device according to claim 19, wherein the semiconductor device is a power device.

21. The semiconductor device according to claim 19, further comprising:

a first electrode electrically connected to the first semiconductor region; and a second electrode electrically connected to the second semiconductor region.

22. The semiconductor device according to claim 17, wherein the semiconductor device is a power device.

23. The semiconductor device according to claim 17, wherein the crystal is a mixed crystal.

24. The semiconductor device according to claim 17, further comprising:

an oxide film that is arranged in contact with the inversion channel region.

25. The semiconductor device according to claim 24, wherein the oxide film comprises at least one element selected from elements of Group 15 in the periodic table, and the at least one element is phosphorus.

26. A semiconductor device comprising:

a first electrode;

a second electrode;

a gate electrode;

an inversion channel region, the inversion channel region comprising a crystal that has a corundum structure, wherein when a voltage is applied to the gate electrode, a conductivity type of the inversion channel region is inverted and electrons flow from the first electrode to the second electrode, and wherein the crystal includes a p-type dopant.

27. A semiconductor device comprising:

a first electrode;

a second electrode;

a gate electrode;

an inversion channel region; and an oxide semiconductor film comprising a crystal that has a corundum structure at the inversion channel region, wherein when a voltage is applied to the gate electrode, a conductivity type of the inversion channel region is inverted and electrons flow from the first electrode to the second electrode, and wherein the crystal includes a p-type dopant.

* * * * *